United States Patent
Yang et al.

(10) Patent No.: US 9,659,666 B2
(45) Date of Patent: May 23, 2017

(54) DYNAMIC MEMORY RECOVERY AT THE SUB-BLOCK LEVEL

(71) Applicant: SanDisk Technologies LLC, Plano, TX (US)

(72) Inventors: Niles Nian Yang, Mountain View, CA (US); Chris Avila, Saratoga, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/841,046

(22) Filed: Aug. 31, 2015

(65) Prior Publication Data

US 2017/0062067 A1    Mar. 2, 2017

(51) Int. Cl.
G11C 16/10    (2006.01)
G11C 16/34    (2006.01)
G11C 16/26    (2006.01)

(52) U.S. Cl.
CPC .......... *G11C 16/3404* (2013.01); *G11C 16/10* (2013.01); *G11C 16/26* (2013.01)

(58) Field of Classification Search
CPC ............................... G11C 16/26; G11C 16/10
USPC ...................................... 365/185.09, 185.24
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,270,975 A | 12/1993 | McAdams |
| 5,570,315 A | 10/1996 | Tanaka et al. |
| 5,602,789 A | 2/1997 | Endoh et al. |
| 5,661,053 A | 8/1997 | Yuan |
| 5,673,222 A | 9/1997 | Fukumoto et al. |
| 5,768,192 A | 6/1998 | Eitan |
| 5,822,256 A | 10/1998 | Bauer et al. |
| 5,903,495 A | 5/1999 | Takeuchi et al. |
| 5,987,632 A * | 11/1999 | Irrinki ............ G11C 29/44 365/201 |
| 6,011,725 A | 1/2000 | Eitan |
| 6,046,935 A | 4/2000 | Takeuchi et al. |

(Continued)

FOREIGN PATENT DOCUMENTS

| | | |
|---|---|---|
| EP | 2 261 806 A1 | 12/2010 |
| WO | 2007016167 A1 | 2/2007 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Michael Tran
(74) *Attorney, Agent, or Firm* — Foley & Lardner LLP

(57) ABSTRACT

A non-volatile flash memory has bit lines spanning multiple blocks grouped into columns, where each block is connected along multiple regular columns and one or more redundancy columns. When there is a local column defect, so that the defect is not at the level of the whole block or global column, the portions of a column at an individual block can be remapped to a portion of the same block along a redundant column. Sections of multiple columns from different blocks can be remapped to the same redundancy column. Then a memory block includes a number of independently accessible sub-blocks, the process can also be implemented at the sub-block level. A dynamic, system level implementation is presented.

21 Claims, 16 Drawing Sheets

(56) References Cited

U.S. PATENT DOCUMENTS

| | | |
|---|---|---|
| 6,219,286 B1 | 4/2001 | Fuchigami et al. |
| 6,222,762 B1 | 4/2001 | Guterman et al. |
| 6,285,597 B2 | 9/2001 | Kawahara et al. |
| 6,370,075 B1 | 4/2002 | Haeberli et al. |
| 6,556,465 B2 | 4/2003 | Haeberli et al. |
| 6,560,143 B2 | 5/2003 | Conley et al. |
| 6,760,262 B2 | 7/2004 | Haeberli et al. |
| 6,922,096 B2 | 7/2005 | Cernea |
| 7,012,835 B2 | 3/2006 | Gonzalez et al. |
| 7,030,683 B2 | 4/2006 | Pan et al. |
| 7,135,910 B2 | 11/2006 | Cernea |
| 7,158,421 B2 | 1/2007 | Li et al. |
| 7,206,230 B2 | 4/2007 | Li et al. |
| 7,243,275 B2 | 7/2007 | Gongwer et al. |
| 7,304,893 B1 | 12/2007 | Hemink et al. |
| 7,345,928 B2 | 3/2008 | Li |
| 7,368,979 B2 | 5/2008 | Govindu et al. |
| 7,440,319 B2 | 10/2008 | Li et al. |
| 7,554,311 B2 | 6/2009 | Pan |
| 7,616,484 B2 | 11/2009 | Auclair et al. |
| 7,616,499 B2 | 11/2009 | Wan et al. |
| 7,683,700 B2 | 3/2010 | Huynh et al. |
| 7,716,538 B2 | 5/2010 | Gonzalez et al. |
| 7,795,952 B2 | 9/2010 | Lui et al. |
| 7,864,588 B2 | 1/2011 | Betser et al. |
| 7,969,235 B2 | 6/2011 | Pan |
| 7,973,592 B2 | 7/2011 | Pan |
| 8,027,195 B2 | 9/2011 | Li et al. |
| 8,040,744 B2 | 10/2011 | Gorobets et al. |
| 8,054,680 B2 | 11/2011 | Matsuzaki et al. |
| 8,102,705 B2 | 1/2012 | Liu et al. |
| 8,379,454 B2 | 2/2013 | Kochar et al. |
| 8,726,104 B2 | 5/2014 | Sharon |
| 8,750,042 B2 | 6/2014 | Sharon et al. |
| 8,775,901 B2 | 7/2014 | Sharon et al. |
| 8,933,516 B1 | 1/2015 | Wu et al. |
| 2002/0007386 A1 | 1/2002 | Martin et al. |
| 2003/0117851 A1 | 6/2003 | Lee et al. |
| 2003/0217323 A1 | 11/2003 | Guterman et al. |
| 2004/0022092 A1 | 2/2004 | Dvir et al. |
| 2005/0024939 A1 | 2/2005 | Chen et al. |
| 2005/0219896 A1 | 10/2005 | Chen et al. |
| 2006/0090112 A1 | 4/2006 | Cochran et al. |
| 2006/0221714 A1 | 10/2006 | Li et al. |
| 2006/0227602 A1 | 10/2006 | Honma et al. |
| 2006/0239111 A1 | 10/2006 | Shingo |
| 2006/0256629 A1 | 11/2006 | Roohparvar |
| 2007/0030732 A1 | 2/2007 | Micheloni et al. |
| 2007/0030742 A1* | 2/2007 | Lunde ................ G11C 29/808 365/200 |
| 2007/0103978 A1* | 5/2007 | Conley .............. G11C 16/0483 365/185.09 |
| 2007/0139099 A1 | 6/2007 | Pan |
| 2007/0171719 A1 | 7/2007 | Hemink et al. |
| 2007/0280000 A1 | 12/2007 | Fujiu et al. |
| 2007/0296391 A1 | 12/2007 | Bertin et al. |
| 2008/0307342 A1 | 12/2008 | Furches et al. |
| 2009/0055621 A1 | 2/2009 | Nakanishi et al. |
| 2009/0058506 A1 | 3/2009 | Nandi et al. |
| 2009/0058507 A1 | 3/2009 | Nandi et al. |
| 2009/0063918 A1 | 3/2009 | Chen et al. |
| 2009/0100290 A1 | 4/2009 | Nakanishi et al. |
| 2009/0153230 A1 | 6/2009 | Pan et al. |
| 2009/0153232 A1 | 6/2009 | Fort et al. |
| 2009/0168569 A1* | 7/2009 | Ryu ..................... G11C 29/808 365/200 |
| 2009/0225607 A1 | 9/2009 | Chen et al. |
| 2009/0295434 A1 | 12/2009 | Umeda et al. |
| 2009/0315616 A1 | 12/2009 | Nguyen et al. |
| 2009/0316483 A1 | 12/2009 | Kim et al. |
| 2010/0054019 A1 | 3/2010 | Toda |
| 2010/0070209 A1 | 3/2010 | Sai |
| 2010/0091568 A1 | 4/2010 | Li et al. |
| 2010/0091573 A1 | 4/2010 | Li et al. |
| 2010/0309719 A1 | 12/2010 | Li et al. |
| 2011/0002169 A1 | 1/2011 | Li et al. |
| 2011/0066793 A1 | 3/2011 | Burd |
| 2011/0096601 A1 | 4/2011 | Gavens et al. |
| 2011/0145633 A1 | 6/2011 | Dickens et al. |
| 2011/0148509 A1 | 6/2011 | Pan |
| 2011/0182121 A1 | 7/2011 | Dutta et al. |
| 2011/0286280 A1 | 11/2011 | Kellam et al. |
| 2012/0008384 A1 | 1/2012 | Li et al. |
| 2012/0008405 A1 | 1/2012 | Shah et al. |
| 2012/0008410 A1 | 1/2012 | Huynh et al. |
| 2012/0075943 A1 | 3/2012 | Chen et al. |
| 2012/0159281 A1* | 6/2012 | Shalvi ................ G06F 11/1044 714/755 |
| 2012/0220088 A1 | 8/2012 | Alsmeier |
| 2012/0281479 A1 | 11/2012 | Kochar et al. |
| 2012/0311407 A1 | 12/2012 | Lee et al. |
| 2013/0007544 A1 | 1/2013 | Nemazie et al. |
| 2013/0028021 A1 | 1/2013 | Sharon et al. |
| 2013/0031429 A1 | 1/2013 | Sharon et al. |
| 2013/0031430 A1 | 1/2013 | Sharon |
| 2013/0031431 A1 | 1/2013 | Sharon et al. |
| 2013/0107628 A1 | 5/2013 | Dong et al. |
| 2013/0229868 A1 | 9/2013 | Koh et al. |
| 2014/0003157 A1 | 1/2014 | Mui et al. |
| 2014/0047291 A1* | 2/2014 | Shalvi ................ G06F 11/1044 714/723 |
| 2014/0169095 A1 | 6/2014 | Avila et al. |
| 2014/0241084 A1 | 8/2014 | Pan et al. |

OTHER PUBLICATIONS

Pan, "Charge Pump Circuit Design," McGraw-Hill, 2006, 26 pages.

Pylarinos et al., "Charge Pumps: An Overview," Department of Electrical and Compter Engineering University of Toronto, www.eecg.toronto.edu/~kphang/ece1371/chargepumps.pdf., 7 pages.

* cited by examiner

DYNAMIC MEMORY RECOVERY AT THE SUB-BLOCK LEVEL

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

Methods are presented for the operating of a memory system. This includes determining that a portion of a first sub-block of a first block along a first regular column is defective. The memory system includes a memory circuit includes an array having a plurality of blocks, each block having a plurality of individually selectable sub-blocks of non-volatile memory cells spanned by a plurality of access columns, each column formed of a plurality of N adjacent bit lines along which the memory cells of the sub-blocks are connectable to sensing circuitry, the columns including a plurality of regular columns and one or more redundancy columns. In response to determining that the portion of the first sub-block along the first regular column is defective, the portion of the first sub-block along the first regular column is remapped to a portion of the first sub-block along a first redundancy column. Neither the portion of the sub-blocks of the first block other than the first sub-block along first regular column nor the portion of blocks other than the first block along first regular column are remapped in response thereto.

Additional methods of operating a memory system include receiving by a memory circuit of the memory system of a request to read a first page of data. The non-volatile memory circuit includes an array having a plurality of blocks, each block having a plurality of individually selectable sub-blocks of non-volatile memory cells spanned by a plurality of access columns, each column formed of a plurality of N adjacent bit lines along which the memory cells of the blocks are connectable to sensing circuitry, the columns including a plurality of regular columns and one or more redundancy columns. It is determined that the first page of data corresponds to a first sub-block in which a portion thereof along a first regular column is remapped to a portion of the first sub-block along a first redundancy column, wherein the remapping for the first sub-block along the first regular column is remapped independently of the portions of the other sub-blocks along the first regular column. The first page of data is provided, wherein the data corresponding to the first regular column of the first sub-block is provided from the first redundancy column of the first sub-block.

A non-volatile memory system includes an array having a plurality of blocks, each block having a plurality of individually selectable sub-blocks of non-volatile memory cells spanned by a plurality of access columns, each column formed of a plurality of N adjacent bit lines along which the memory cells of the blocks are connectable to sensing circuitry, the columns including a plurality of regular columns and one or more redundancy columns. The memory system also includes logic circuitry to control access to the array, wherein the logic circuitry is configured to independently remap portions of sub-blocks along regular columns to the portion of the same sub-block along a first of the redundancy columns such that the remapped regular column of each of the sub-blocks is distinct.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
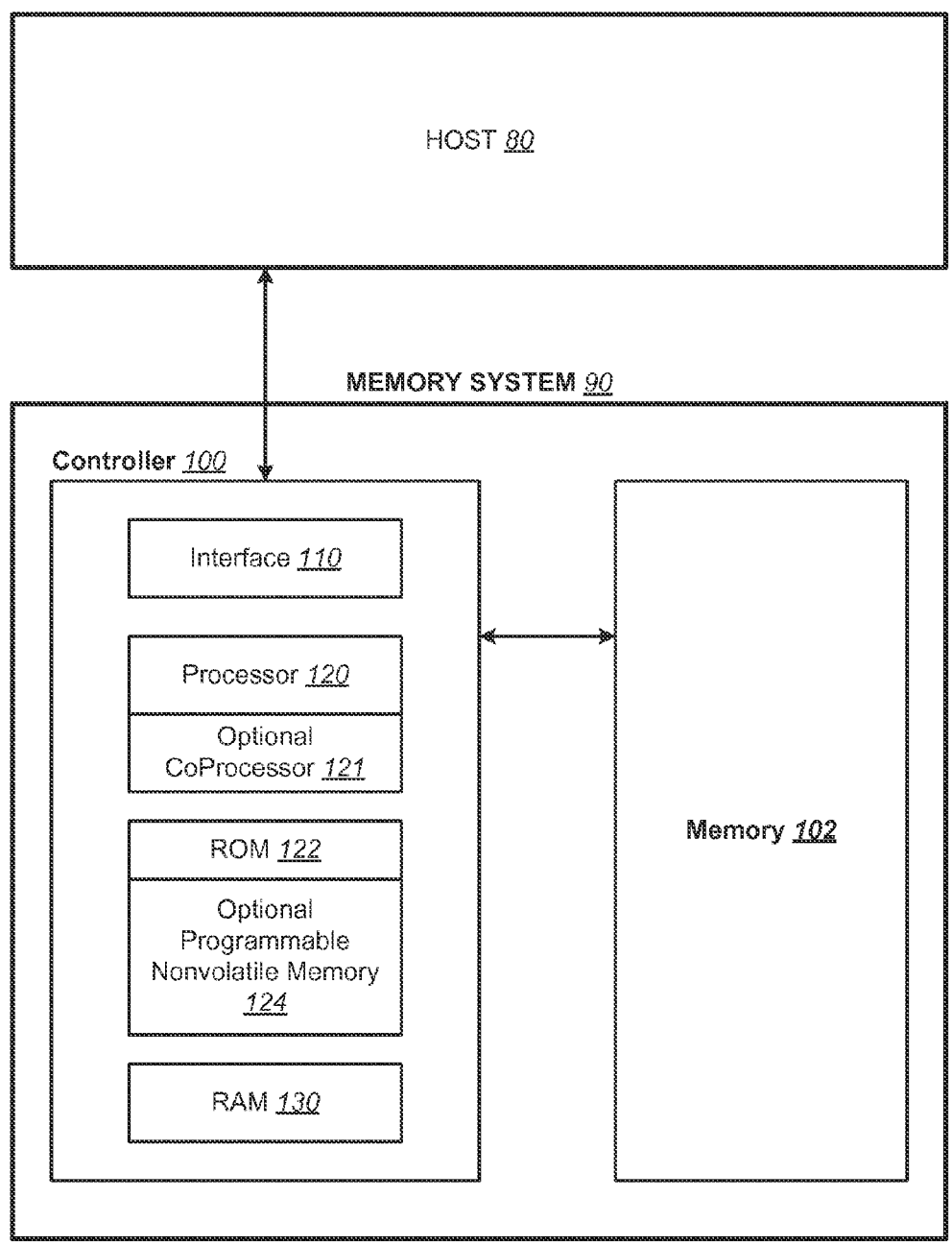
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
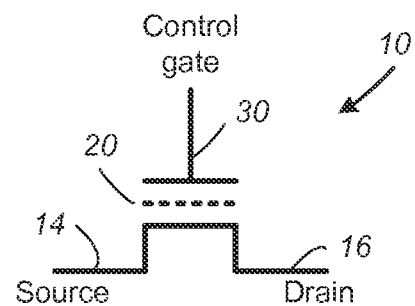
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
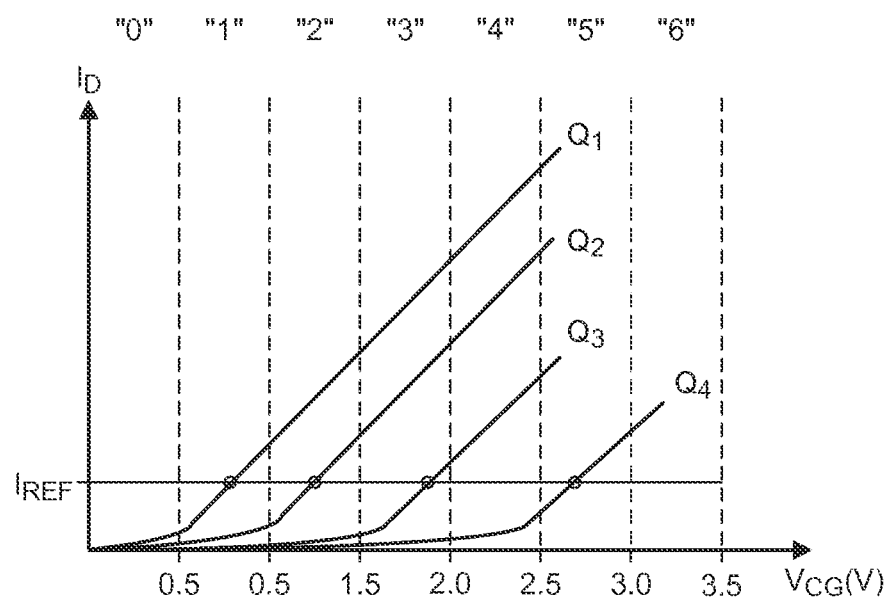
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
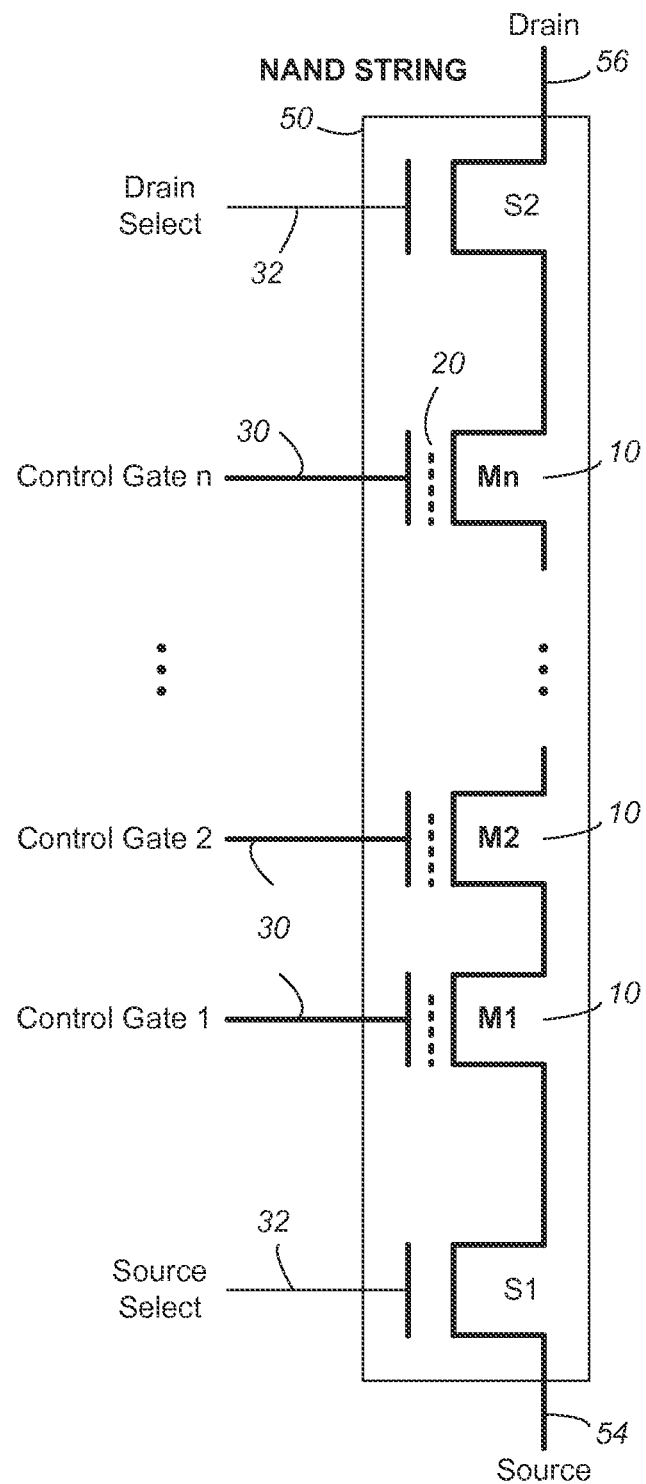
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
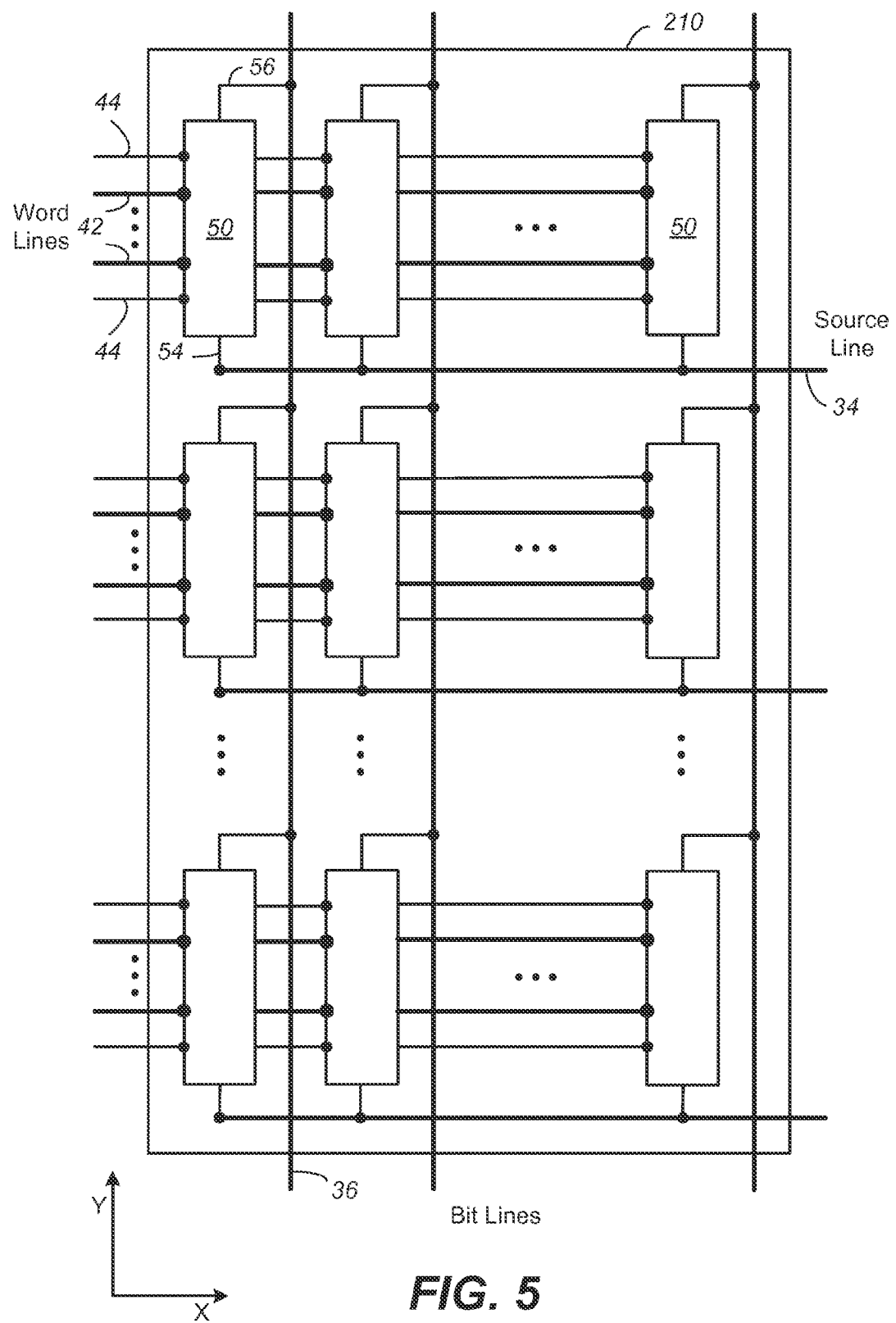
FIG. 5 illustrates an example of a NAND array 210 of memory cells, constituted from NAND strings 50 such as that shown in FIG. 4.
Figure 6:
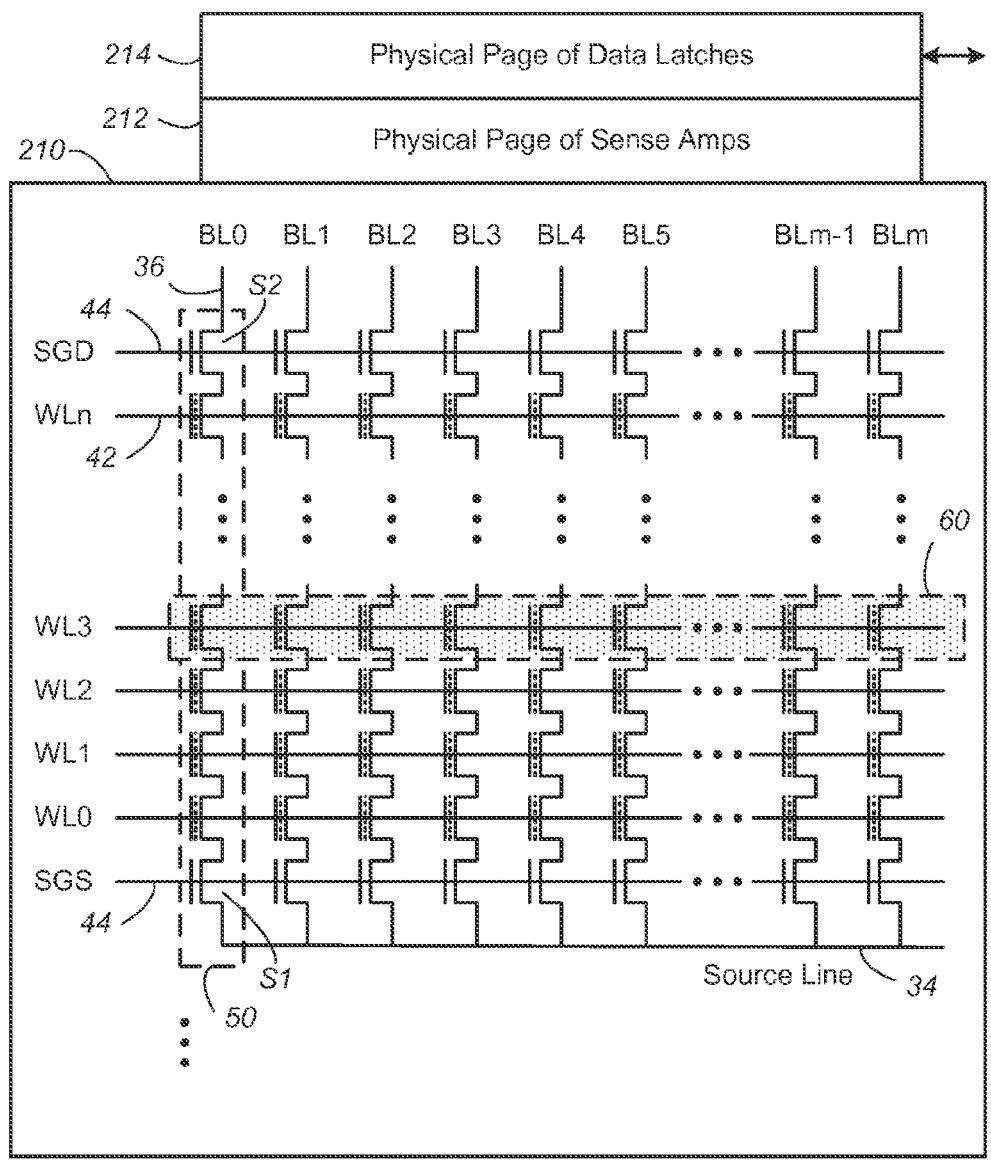
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
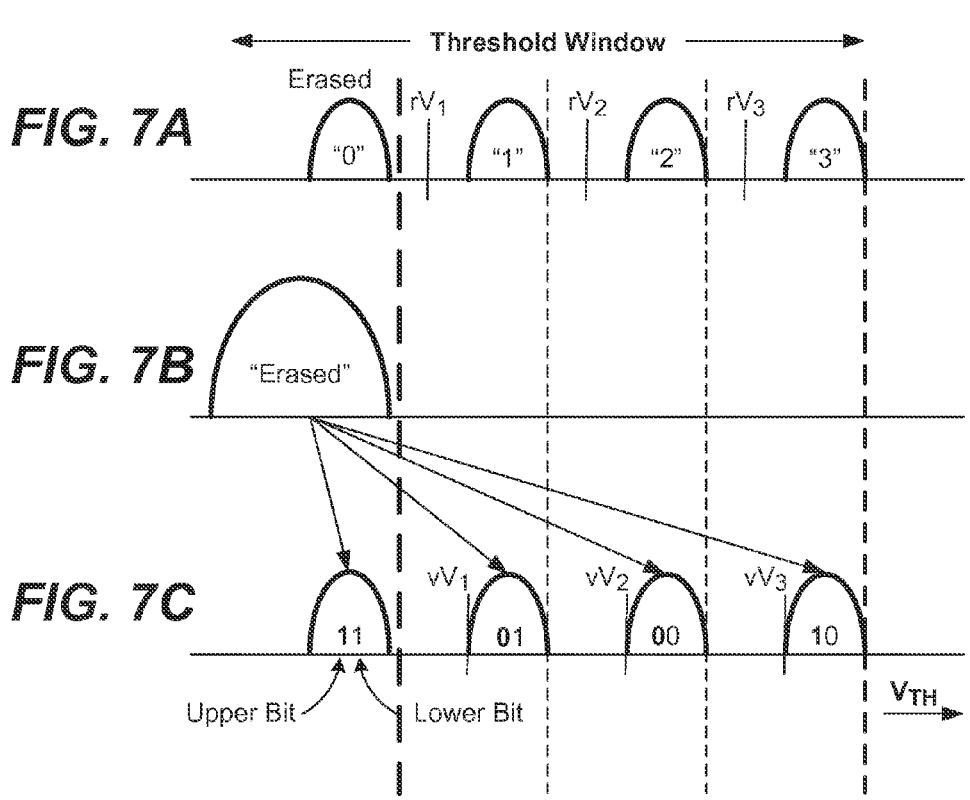
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10'. The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
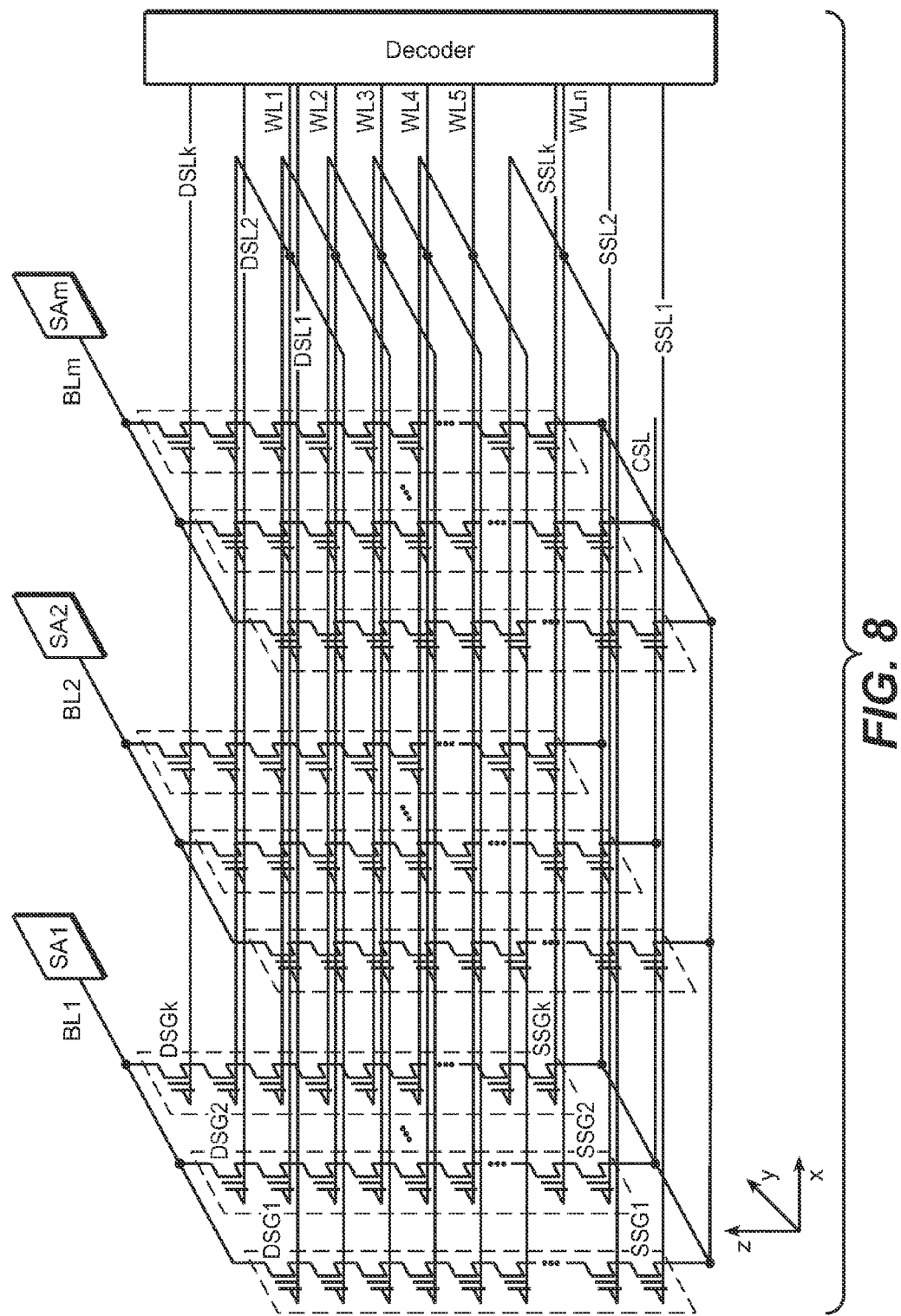
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-m, each run across the top to an associated sense amp SA1-m. The word lines, WL1-n, and source and select lines SSL1-n and DSL-n, then run in x direction, with the NAND string connected at bottom to a common source line CSL.

Figure 9:
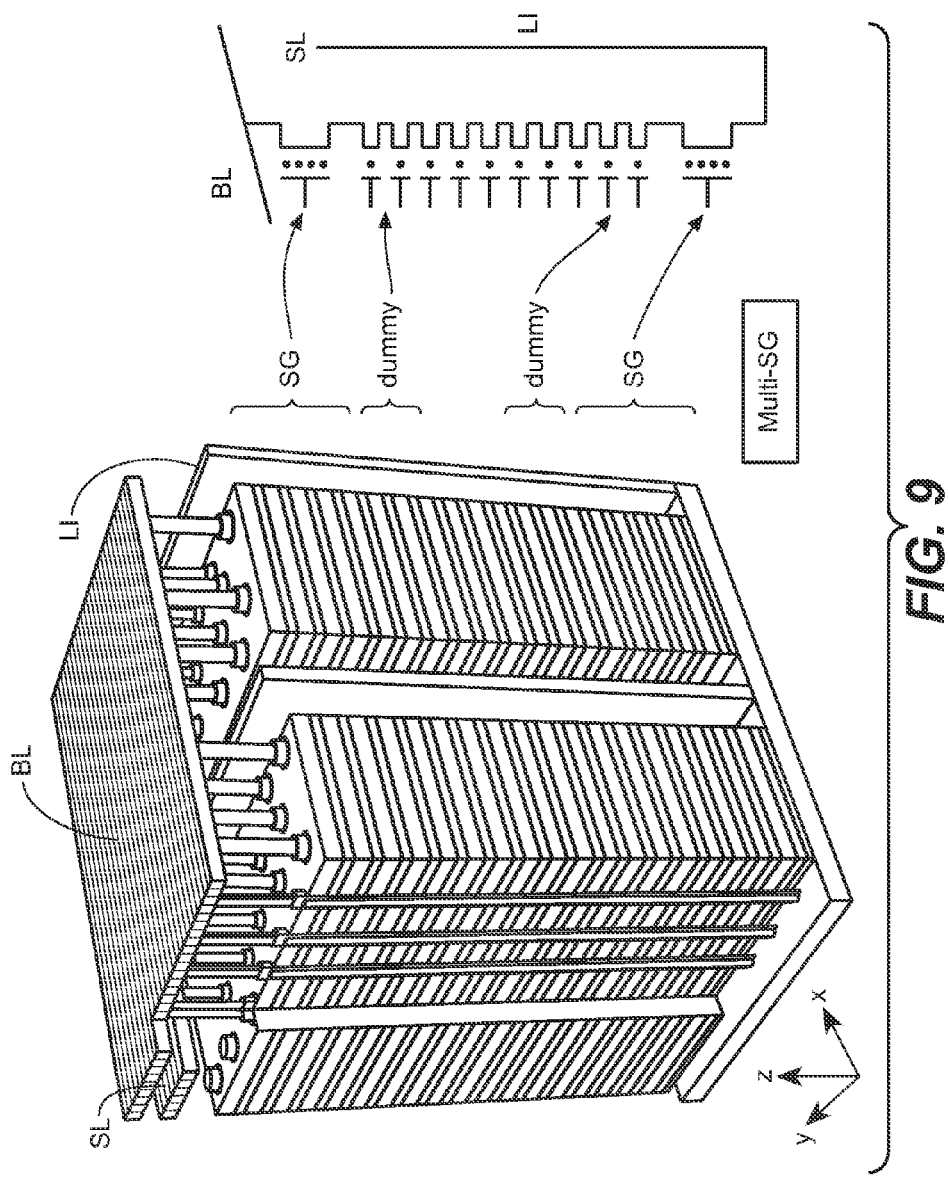
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells along dummy word lines at the ends that are not used to store user data, as their proximity to the select gates makes them more prone to disturbs. These dummy word lines are typically not part of the accessible address space as seen from outside of the memory.

Figure 10:
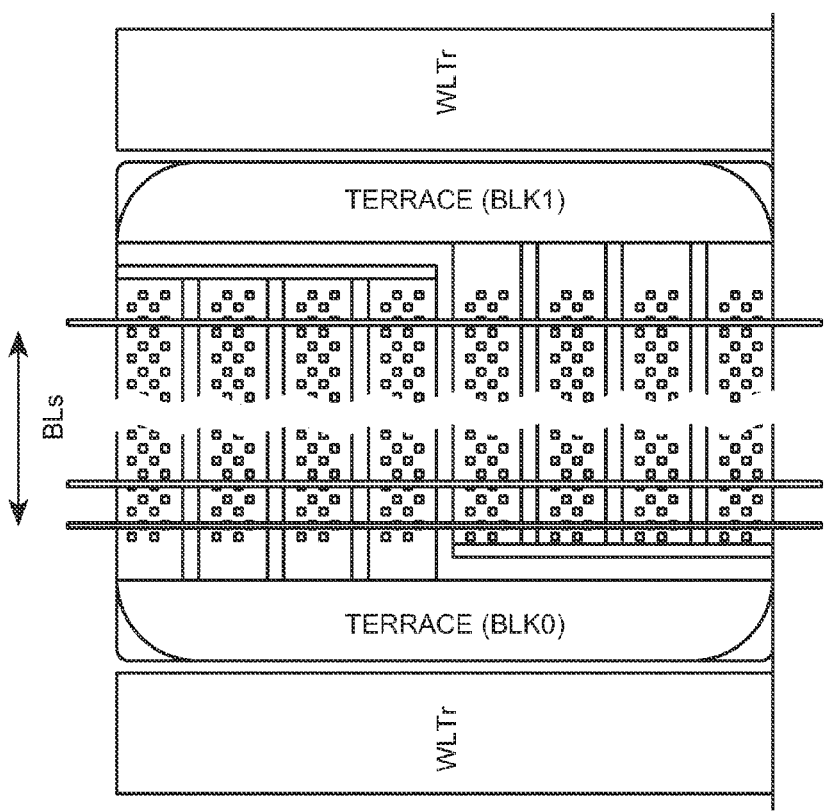

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
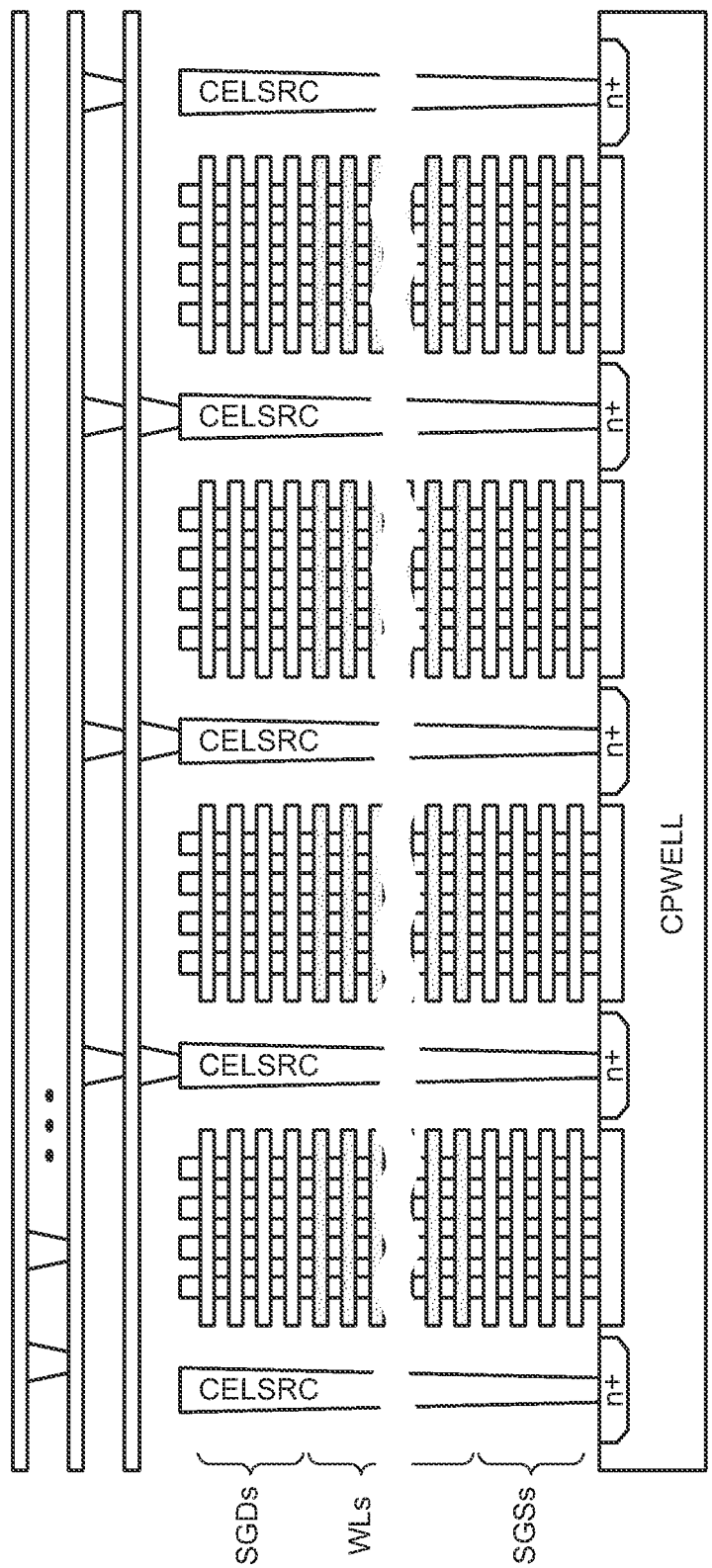

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
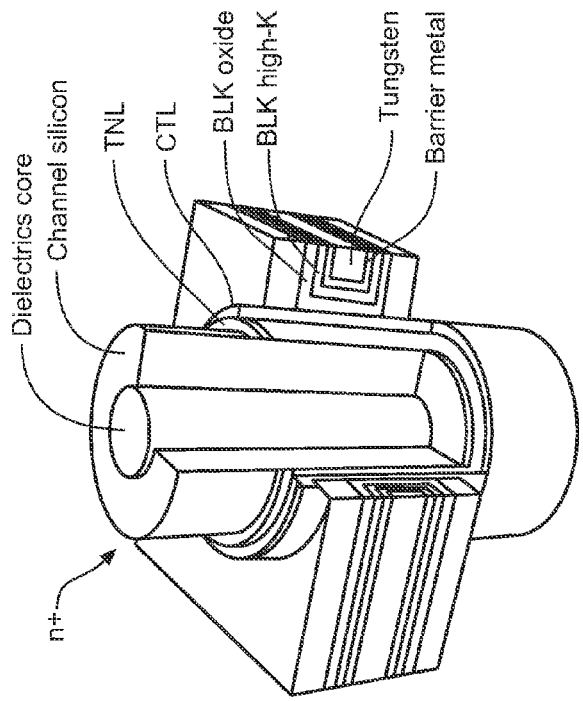

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Block Level Local Column Redundancy Methods for Higher Yield

For memory structures like those described above, bit lines are often grouped into "columns" formed from a set of adjacent bit lines, bit lines that share some peripheral circuitry, or both. For example, a set of, say, 8 or 16 adjacent bit lines may be grouped for decoding purposes. This section looks at the mapping of columns due to memory defects. More detail on column based techniques for memories is given in US patent publications US-2012-0008405, US-2012-0008384, US-2012-0008410, and US-2012-0281479, for example.

One technique to deal with defective columns is through a global column redundancy approach: If there is a global bit line failure (due to a bit line short, an open bit line, sense amp problem, and son), a bad column can be replaced with a redundant columns or isolated and skipped. A global column redundancy method is illustrated with respect to FIG. 13.

Figure 13:
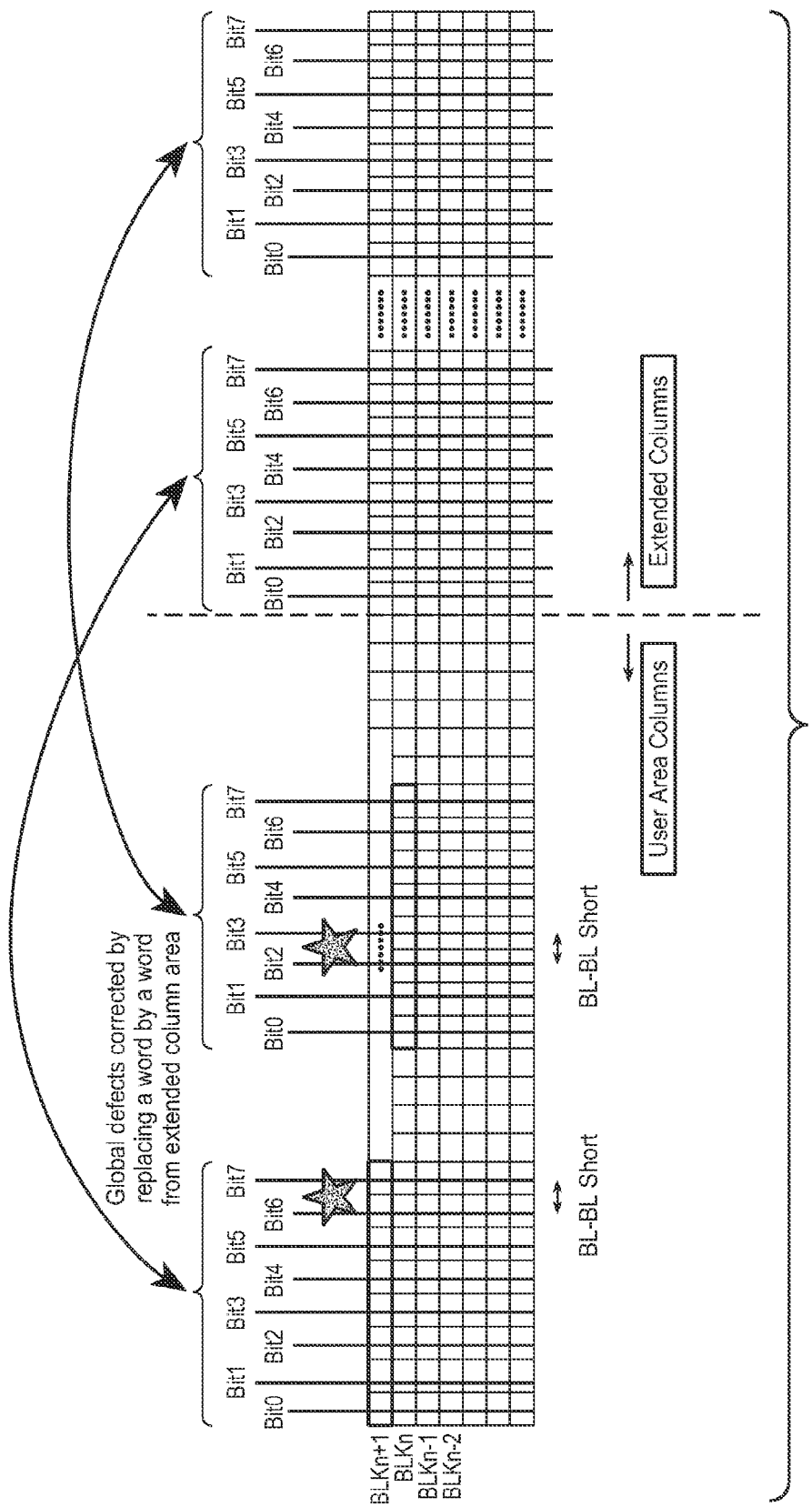
FIG. 13 illustrates a global column redundancy approach.

FIG. 13 is a schematic representation of a portion of a memory array. A number of blocks (BLKn+1, BLKn, BLKn−1, . . . ) are shown as running side to side. Global bit lines will then span these blocks, running up and down as represented in FIG. 13, where the bit lines are grouped in columns of, in this example, 8 bit lines. The number of bit lines/columns exceeds the number that can be assigned for user data, with the additional columns set aside as an extended part of the array for these redundant bit lines. When a column is defective, it can then be remapped to a column in the extended area. For example, FIG. 13 shows two columns in the user area that have a bit line to bit line short, as indicated by the star and also at the bottom. As such, the bit lines cannot be used, but they can each be remapped as shown to a column from the extended area.

This arrangement covers the situation where the defect causes the global column (running down all of the shown blocks) to be bad, such as in the case of a bit line to bit line short. Some defects, however, do not affect the whole of the global word line, but are due to NAND string failures or local column failures. To deal with these more localized failures by a global column remapping, or by mapping out all of a block, can lead to lead to device yield loss due to exceeding limits on the available remapping capacity.

Examples of block level defects that can cause multiple strings or local column to fail include open contact to bit lines connections in 2D NAND; open memory hole issues in 3D NAND/BiCS structures; resistive NAND stings in both 2D and 3D structures; floating gate to floating gate shorts; and other defects. (More detail on various failure mode and their detection is given in a US patent application entitle "Erase Stress and Delta Erase Loop Count Methods for Various Fail Modes in Non-Volatile Memory" of Sagar Magia, Jagdish Sabde, and Jayavel Pachamuthu, filed on the same day as the present application.) The following techniques allow for the remapping of such local defects without have to replace the whole of the global column.

Figure 14:
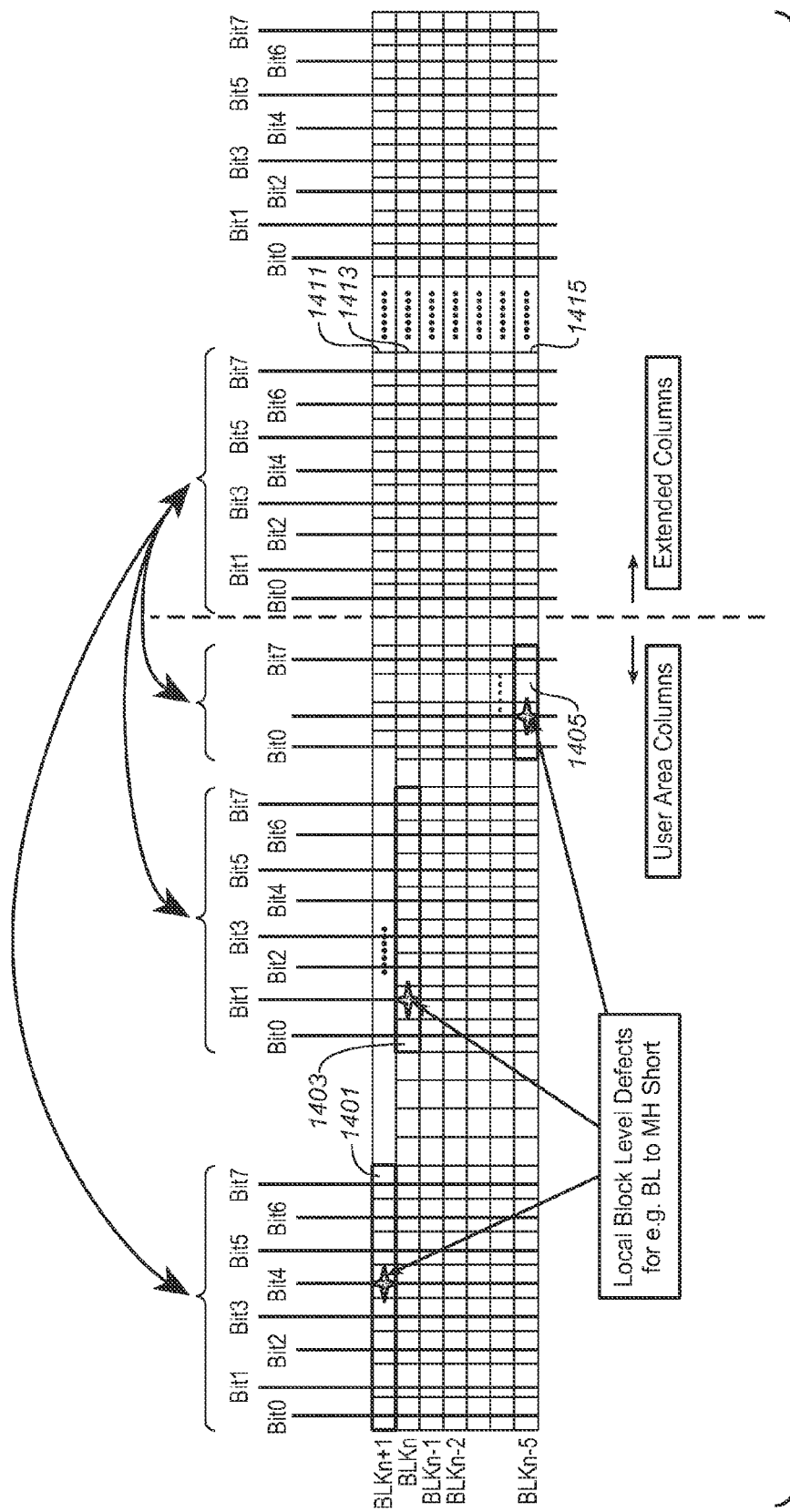
FIG. 14 illustrates block level defects and local column redundancy.

A block level column redundancy method for yield recover is illustrated in FIG. 14, where the same extended column used to repair local block level defects. In the example, block BLKn−1 has a local defect (such as a bit line-memory hole short) in the first shown column; block BLKn has a local defect in the second column; and block BLKn−5 has a local defect in the third shown column. Each is then mapped to the area of the first redundancy column along the first of the extended column. This allows, for example, the portions of the first global column that are not defective (that is, other than block BLKn−1 in this example) to not be remapped and still be used. It also allows the parts of BLKn−1 on other columns to not remapped and still be used. Consequently, this method uses extended columns to replace any local bad columns within the block and also use the same set of extended columns are used to repair local level defects for different blocks.

As far as implementation, there is a limit on extra column usage for the block level local redundancy approach as there are only so many redundant columns. The number of extended columns available for local column redundancy, X, will vary based upon the specifics of the implementation. In a Case 1, if the number of bad columns for a defective block is ≤X, the local column redundancy approach can be applied and the bad block recovered. In a Case 2, the number of bad columns for a defective block is >X, and the local column redundancy approach is not used and the block is instead marked as bad.

Figure 15:
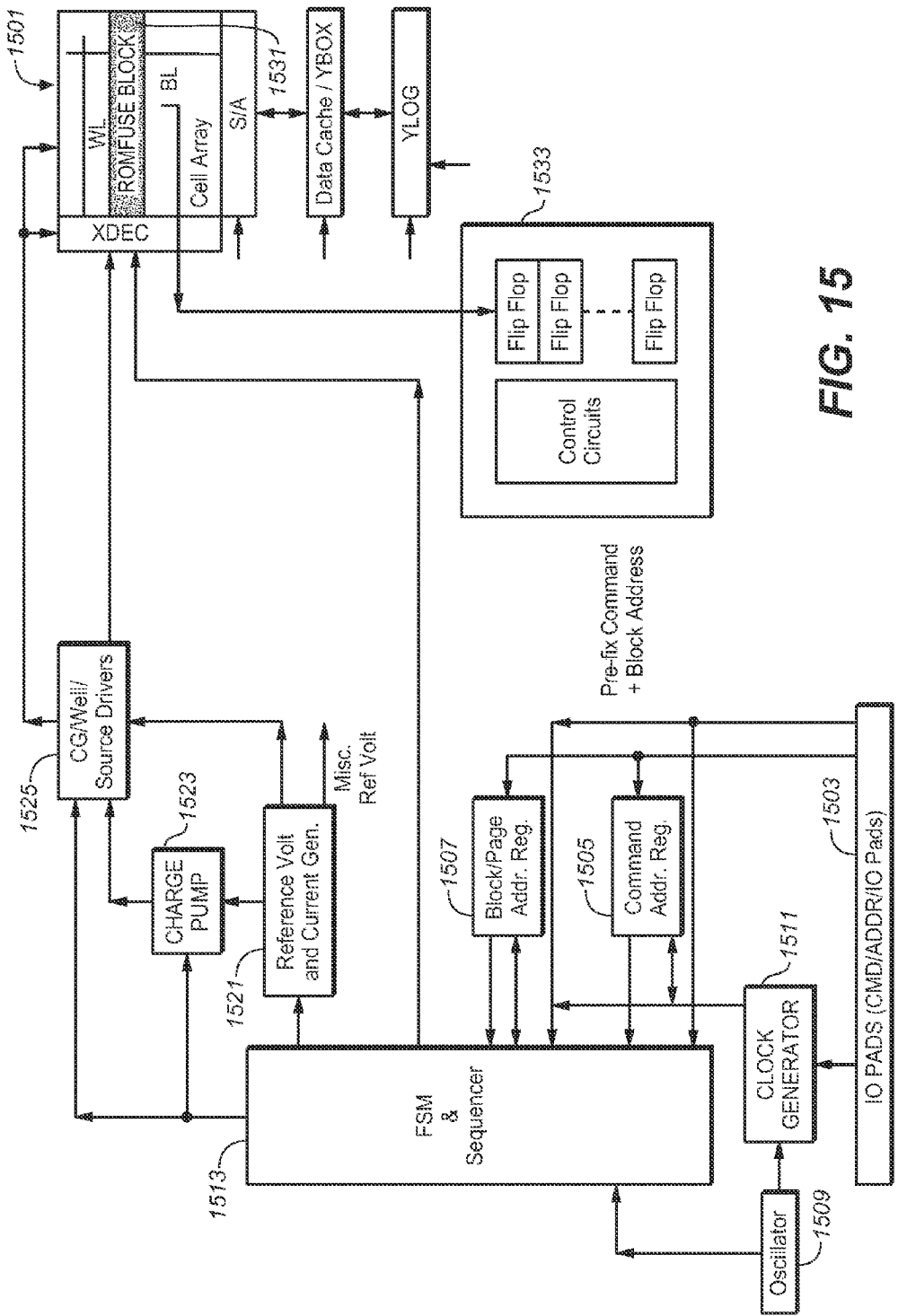
FIG. 15 is an exemplary embodiment of an implementation block diagram.

Considering Case 1 further, the block address and the bad local column address can be stored in a ROM fuse section of the non-volatile memory, where information can be stored in a data and data-bar format, such as in the following:

| Block Address | No of bad columns with local defects | Bad local column addresses |
| --- | --- | --- | where including the number of bad columns is optional. The ROM fuse data has the block addresses that can have multiple bad local column issues. For blocks not having any column failures, the block addresses are not recorded. The ROM fuse data can have up to N number of blocks where, in an exemplary embodiment, N<512, instead of all blocks. In one embodiment, the ROM fuse data can be stored in a dedicated block of the array that accessed by special commands and can be loaded into latches such as illustrated in FIG. 15 as needed. The determination of columns in a block which have local defects can be done as part of a built in self-test (BIST) process. Once bad blocks with local column defects are located, this information (block and column address) can be stored in the ROM fuse using a BIST sequence.

In a first method, a prefix command from the controller to the memory circuit is used for an inbuilt local column redundancy data load plus user (e.g., controller) operation. The command in this arrangement can be of the form (Prefix Command+User operation command sequence), where the user operation sequence can be a read, program or erase. These elements can also be followed by a wait time (Twait), to load the local column redundancy information from the ROM fuse into column redundancy (CR) latches and disable corresponding bad columns (set isolation latches) and subsequently perform user operation. After waiting for status, such as the level of a ready/busy (R/B) signal, the system can then proceed with status check or any other operations.

In another method, this can be implemented with a standalone command sequence for local column redundancy data load so that it can be transparent to the controller. The controller would issue the command followed by Twait. The local column redundancy information is then loaded from the ROM fuse into column redundancy (CR) latches and disable corresponding bad columns are disabled (set isolation latches). After waiting for status, the memory can then proceed with status check and perform regular data sheet operation such as erase, program, and read for that block.

FIG. 15 is a schematic representation of some of the elements on the memory chip that are involved in this process. A number of different embodiments are possible, but FIG. 15 shows some of the basic elements. The array 1501 and its associated decoding and sensing circuitry can be of the BiCS or other 3D variety, but is here shown in more of a 2D sort of representation for simplicity. The memory circuit has a set of IO pads 1503 for commands, addresses and data transfer, which can then be passed on to command and block/page address registers (1505, 1507). An oscillator 1509 can be used with the clock generator to provide needed clock signals. A finite state machine (FSM) and Sequencer block 1513 represented to on-chip control logic that controls the various drivers 1515 for the array 1501. References voltage and current generators 1521 supply the various reference levels, including those supplied to the charge pump circuits block 1523, which then supply the drivers 1525. The array can have a ROM fuse section 1531 to hold the local column redundancy (CR) information. The FSM and Sequencer 1513 perform a ROM fuse read operation to retrieve local CR information for a selected block from 1531. The local ROM fuse CR information is then loaded into the latches of a column redundancy circuit 1533.

The techniques of this section can improve device yield as they allow for many block to be recovered that would otherwise be mapped out. It can also be used at the system level to recover blocks. Typically, many dies on a wafer will have extra columns unused for global column redundancy that can be utilized for block level local column redundancy solution to improve the yield without die size impact.

Dynamic Memory Recovery at the Sub-Block Level

As discussed above with respect to FIGS. 9-11, the blocks of a BiCS-type memory are formed of a number of independently accessible sub-blocks, or "fingers". This section extends the remapping of columns to this sub-block level. Although the following discussion uses the BiCS type 3D memory as the exemplary embodiment, the described techniques can also be extended to other memory structures in which the blocks have individually selected sub-blocks.

This section will also consider the remapping process, whether at the sub-block or other level, from more of a system level. Memory devices are formed into a memory system of several such memory chips and a controller, such a solid state drive (SSD) or memory card. In the exemplary embodiment, the system identifies the portion of the finger failure in a block, then recovers the bad portion of the sub-block/finger by using the bit line column redundancy of the extended columns. This can be done at the system level management in order to replace the bad portion of inside the finger and the block address can be identified in the file system for the system to record and access.

Figures 16, 19:
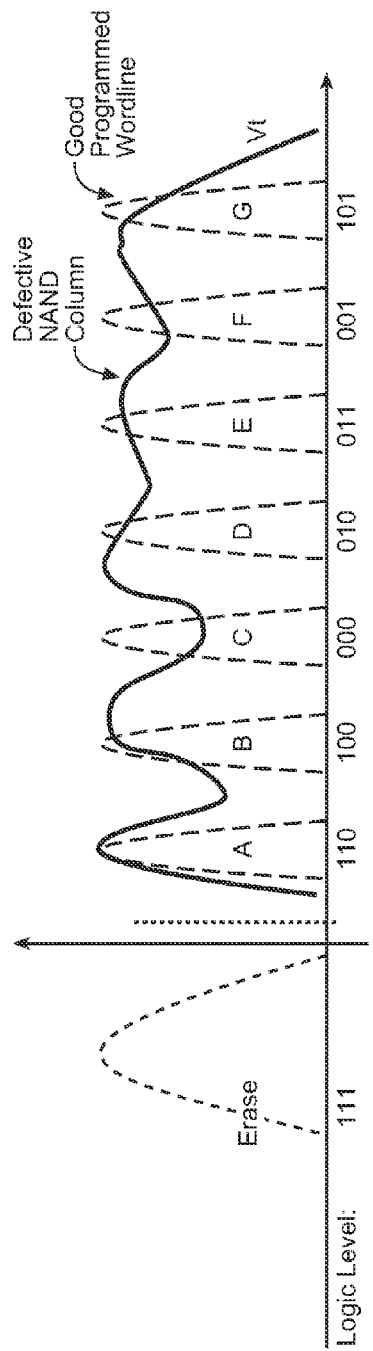
FIG. 16 shows the Vt distribution of a defective NAND column.
FIG. 19 is an example of a system bitmap for the block and finger that has its bad NAND columns replaced by extended columns.

As discussed in earlier sections, a column can fail for a number of reasons. If, for whatever reason select gate became defective or its threshold voltage (Vt) drifted away from the target value, or the bit line connection to the NAND column is defective, or the word lines become bad (Vt shifts, program/erase failure) inside the NAND column, the NAND column will fail. If the degree of failure of this kind becomes more than a certain amount in a sub-block, the entire sub-block may be deemed a failure and the block can be at risk of being scrubbed due to the failures of the NAND columns. FIG. 16 illustrates an example of the Vt distribution of a defective NAND column, showing that an affected finger will have its data corrupted severely.

This section presents a solution as the system level that intelligently manages the NAND column defects inside the fingers by using unused redundant extended columns (REDCOL, or CRD) to replace bad NAND columns of a sub-block or of a block. As discussed above with respect to FIG. 13, the extended REDCOL columns were typically used to replace the bad global columns (bad bit lines that affect entire memory plane of the memory array). Often, as a technology matures, the redundant columns are not entirely used as the memory quality improves. Thus, to handle the grown bad block defects (GBB), the unused REDCOL can be used for the particular block that became bad due to small number of failures in its NAND columns from a particular sub-block. For 3D NAND, the NAND columns are located inside one of the multiple sub-blocks/fingers of the block, thereby saving the NAND columns is equivalent to saving the sub-block.

Figure 17:
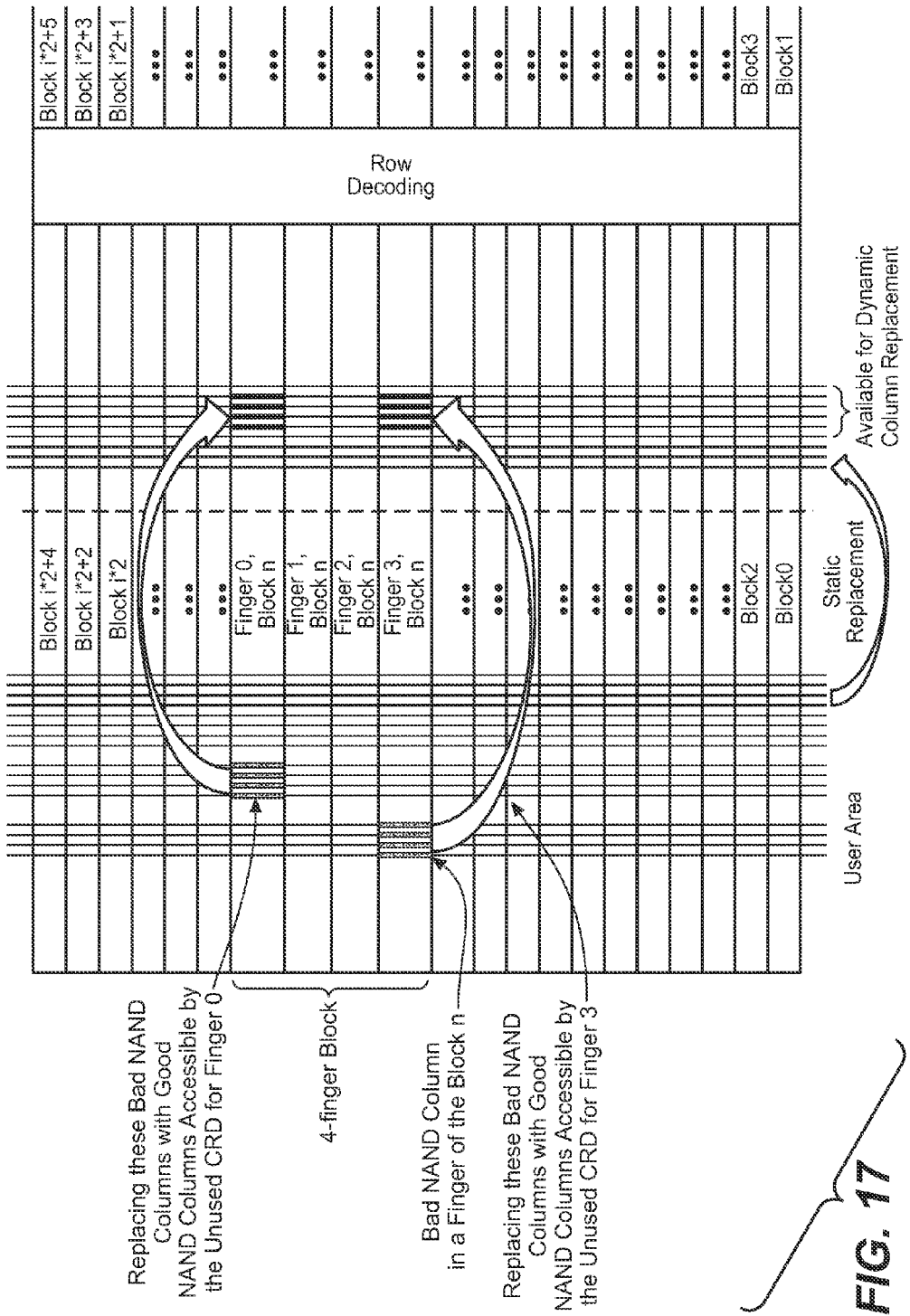
FIG. 17 illustrates the replacement of bad columns of the sub-blocks at the local level.

FIG. 13 illustrates a static column replacement scheme, where not every extended column (CRD) has been used for replacing the global bad columns. FIG. 14 illustrates block level defects and local column redundancy. FIG. 17 shows the dynamic column replacement by using unused CRD or REDCOL from the global bit line column replacement for the block and finger level for bad local column replacement.

FIG. 17 represents an array with two planes, where even numbered blocks to the left of the row decoding block and odd numbered blocks to the left. The vertical lines on the left plane here represent columns, rather than individual bit lines, with the user area columns to the left of the broken line and the extended, redundant columns to the right. Each block has, in this example, four sub-blocks or fingers, where only Block n is expanded out to show these explicitly. As shown by the arrow at bottom, three global columns have undergone a static replacement of the sort described with respect to FIG. 13. This leaves a number of unused redundant columns for dynamic column replacement at the block and sub-block level. In Block n, fingers 0 and 3 each have four bad local columns that are replace with good redundant columns. The bad columns of the two sub-blocks are here different, but can both be replaced with the same redundant columns. The system records these replacements for when these columns are later accessed.

In a system level implementation for dynamic column replacement, the system can store the bad column information in the non-volatile memory in a "ROMFUSE" section where it maintains system data for managing the memory. The controller can then read out the bad column information from the memory "ROMFUSE", so the system knows which extended columns are still available for dynamic use. The bad sub-block information is read from the memory ROMFUSE, so the system knows which bad sub-block are present and will not replace them. During usage, the memory system can then monitor the sub-block health of the blocks, such as by measuring the Vt distribution of the source and drain select gates. This allows for the system to acquire the information on the bad NAND columns of a sub-block/finger, record the block/sub-block/NAND columns in the system, evaluate if an extended column (REDCOL) replacement is achievable, and then replace the bad user area column by an extended area column.

Figure 18:
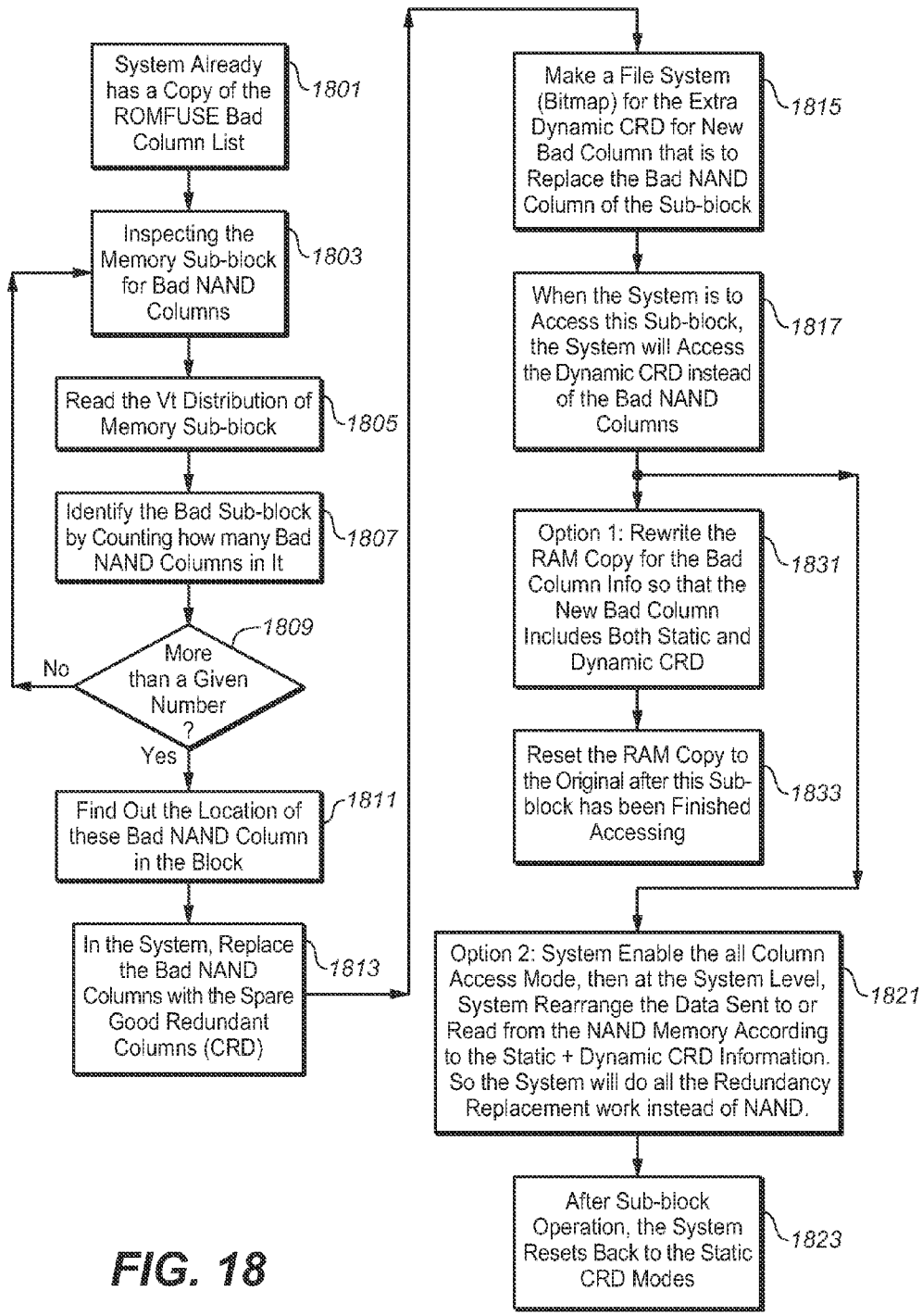
FIG. 18 is a flow for a system level implementation to handle the column replacement by redundant columns for a bad sub-block.

FIG. 18 illustrates some details of this process for an exemplary embodiment. The system may already have a copy of the bad column list from device sort or earlier operation once the system is in use, obtained such as described in earlier sections, that it maintains in non-volatile memory (in the ROMFUSE) section, as noted as 1801. Beginning at 1803, when a memory sub-block is becoming bad, the system can check a failure signature, such as a bit error rate or checking the threshold distributions of the sub-block as at 1805. A scan of select gates and/or dummy word lines of the bad finger/sub-block is made to see if some of them become defective with Vt shifts that affect the entire NAND column they control. The select gates and dummy word lines can also be made for good sub-blocks and if the select gate and dummy word line failures from both bad and good sub-blocks are comparable, this indicates that they are not responsible for the high number of column failures. In this case, the NAND column failures are from the normal word lines in the sub-block and the recovery may not be feasible and the process is quit.

If the select gate and dummy word line failures from the bad and good sub-blocks are not comparable, with the bad sub-block showing worse Vt shifts, then the select gates or dummy word lines may be responsible for the high number of NAND column failures. In this case, the NAND column failures are from the select gate and dummy word lines, where the bad sub-blocks are identified and the number of bad columns in it are counted at 1807. At 1809, if the number is less than a certain number, which can a fixed or settable parameter, the process can loop back to 1803; and if more, it can proceed on to 1811.

The location of the bad columns is determined at 1811. For example, the Vt distribution of the select gates or dummy word lines can be read with a preset read voltage on their control gates to the system's RAM. The results can be XNOR-ed with an FFh data pattern for all columns (excluding the bad columns used for the bad bit lines already) by the controller in the system. After XNOR-ing, the locations that show '1' are where the defective NAND columns are located. The location can be recorded in the controller's RAM. The controller can then calculate the number of these columns, 'x', and the location of these bad NAND column for the block finger.

Once the system has acquired the bad column data from non-volatile memory (ROMFUSE), it can check if there is still unused extended column space after the bad bit line replacement that was done at the die sort. If there are still bad columns left, then at 1813 the system can make a bitmap table showing the bad sub-blocks that have local NAND columns replaced. The bad sub-blocks are recorded in the bitmap. At 1815 a file system table is made that records the bad NAND column addresses and replacement extended column addresses for this die/plane/block/sub-block, such as is illustrated in FIG. 19. The system can replace as much as allowed by the remaining extended column area for the bad NAND columns of the sub-block and make the entries to the file system table.

When subsequently accessing the block finger at 1817, such as for s read or program operation applied to a sub-block, the system can check the bitmap to see if this sub-block has had its columns replaced by redundant columns. If so, then in a first option ("Option 1"), the process continues to 1821 and uses the file system table for the extended column data for the access, in addition to any other bit line re-mapping being used: an all column (both user area and extended area) access mode is enabled; the data is acquired for all these columns and then transferred to the controller; the system then filters out the static bad columns and the dynamic bad columns. The static and dynamic column replacements then allow the controller to supply the expected amount of data, after which the system can reset the remapping data back to just the global, static column remapping.

Alternately, in another option at 1831 ("Option 2"), rather than going to 1821 (Option 1), the system can also temporarily alter the controller's RAM copy of ROMFUSE data in the non-volatile memory, and change the bad column information there so that the NAND will treat both the static and dynamic extended columns as a new static column remapping, and inside the NAND the circuit will take care of the data address of the data. This is useful for both the program and read operations. After accessing, the controller's RAM copy of the column re-mapping data is reset at 1833. For either option, if there is no dynamic column remapping for the block/sub-block, then the system performs its memory operations on the block without using the dynamic remapping for this sub-block, but using only the static remapping.

FIG. 19 is an example of a system bitmap for the block and sub-block that has its bad NAND columns replaced by redundancy columns (CRD). A "y" in the sub-block slot for a remapped sub-block, where the offset to the replacement in the extended column area is at right for each block.

The techniques of this section allow for the recovery of the bad portion of a sub-block in the block to avoid grown bad blocks of the system, saving capacity and enhancing the reliability of the system. This provides the flexibly to re-align the block with proper usage according to the extent of replacement, and provides very high yield and lowering the number of defective devices

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A method of operating a memory system, comprising:
   determining that a portion of a first sub-block of a first block along a first regular column is defective, where the memory system includes a memory circuit that includes an array having a plurality of blocks, each block having a plurality of individually selectable sub-blocks of a plurality of non-volatile memory cells spanned by a plurality of access columns and where each sub-block of a block is selectable by a common select signal independently of other sub-blocks of the block, and wherein each access column is formed of a plurality of N adjacent bit lines along which the memory cells of the sub-blocks are connectable to sensing circuitry, the access columns including a plurality of regular columns and one or more redundancy columns; and
   in response to determining that the portion of the first sub-block along the first regular column is defective, remapping the portion of the first sub-block along the first regular column to a portion of the first sub-block along a first redundancy column,
   wherein neither a portion of sub-blocks of the first block other than the first sub-block along the first regular column nor a portion of blocks other than the first block along the first regular column are remapped in response thereto.

2. The method of claim 1, wherein the memory system further includes a controller, and the determining that a portion of the first sub-block of the first block along the first regular column is defective is in response to an operation scheduled by the controller.

3. The method of claim 1, further comprising:
   determining that a portion of a second sub-block along a second regular column is defective; and
   in response to determining that the portion of the second sub-block along the second regular column is defective, remapping the portion of the second sub-block along the second regular column to a portion of the second sub-block along the first redundancy column, wherein the portion of sub-blocks other than the second sub-block along the second regular column are not remapped in response thereto.

4. The method of claim 3, wherein the second sub-block is a sub-block of the first block.

5. The method of claim 3, wherein the second sub-block is not a sub-block of the first block.

6. The method of claim 4, wherein the first and second regular columns are the same.

7. The method of claim 4, wherein the first and second regular columns are different.

8. The method of claim 1, wherein the memory system further includes a controller and the determining that the portion of the first sub-block along the first regular column is defective is performed in response to a read error result as determined by the controller.

9. The method of claim 1, wherein the memory system further includes a controller and the controller maintains in non-volatile memory a copy of information on the remapping.

10. The method of claim 1, wherein the memory circuit is a monolithic three-dimensional semiconductor memory device where the memory cells are arranged in multiple physical levels above a silicon substrate and comprise a charge storage medium.

11. A method of operating a memory system, comprising:
receiving by the memory system a request to read a first page of data, where the memory system includes a memory circuit that includes an array having a plurality of blocks, each block having a plurality of individually selectable sub-blocks of non-volatile memory cells spanned by a plurality of access columns and where each sub-block of a block is selectable by a common select signal independently of other sub-blocks of the block, and wherein each access column is formed of a plurality of N adjacent bit lines along which the memory cells of the blocks are connectable to sensing circuitry, the access columns including a plurality of regular columns and one or more redundancy columns;
determining that the first page of data corresponds to a first sub-block in which a portion thereof along a first regular column is remapped to a portion of the first sub-block along a first redundancy column, wherein the remapping for the first sub-block along the first regular column is remapped independently of portions of other sub-blocks along the first regular column; and
providing the first page of data, wherein the data corresponding to the first regular column of the first sub-block is provided from the first redundancy column of the first sub-block.

12. The method of claim 11, wherein the memory system further including a controller and the memory circuit receives the request to read the first page of data from the controller, wherein the memory circuit provides the controller with the first page of data where the data corresponding to the first regular column of the first sub-block is replaced from the first redundancy column of the first sub-block.

13. The method of claim 11, wherein the memory system further including a controller and the memory circuit receives the request to read the first page of data from the controller, wherein, in response to the request to read the first page of data, the memory circuit transfers to the controller a read result from the first regular column and the first redundancy column to the controller and the determining and providing are performed by the controller.

14. The method of claim 11, further comprising:
receiving a request to read a second page of data;
determining that the second page of data corresponds to a second sub-block in which a portion thereof along a second regular column is remapped to a portion of the second sub-block along a first redundancy column, wherein the second sub-block is different that the first sub-block and the remapping for the second sub-block along the second regular column is remapped independently of portions of other sub-blocks along the second regular column; and
providing the second page of data, wherein the data corresponding to the second regular column of the second sub-block is provided from the first redundancy column of the second sub-block.

15. The method of claim 11, wherein the first and second regular column are the same.

16. The method of claim 11, wherein the first and second regular column are different.

17. The method of claim 11, wherein the memory circuit is a monolithic three-dimensional semiconductor memory device where the memory cells are arranged in multiple physical levels above a silicon substrate and comprise a charge storage medium.

18. A non-volatile memory system comprising:
an array having a plurality of blocks, each block having a plurality of individually selectable sub-blocks of non-volatile memory cells spanned by a plurality of access columns, where each sub-block of a block is selectable by a common select signal independently of other sub-blocks of the block, and wherein each access column is formed of a plurality of N adjacent bit lines along which the memory cells of the blocks are connectable to sensing circuitry, the access columns including a plurality of regular columns and one or more redundancy columns; and
logic circuitry to control access to the array, wherein the logic circuitry is configured to independently remap portions of sub-blocks along the regular columns to the portion of the same sub-block along a first of the redundancy columns such that remapped regular column of each of the sub-blocks is distinct.

19. The non-volatile memory system of claim 18, wherein the memory system includes a memory circuit on which the array and logic circuitry are formed.

20. The non-volatile memory system of claim 18, wherein the memory system includes a memory circuit on which the array is formed and a controller circuit on which the logic circuitry is formed.

21. The non-volatile memory system of claim 18, wherein the array is part of a monolithic three-dimensional semiconductor memory device where the memory cells are arranged in multiple physical levels above a silicon substrate and comprise a charge storage medium.

* * * * *